United States Patent
Gao et al.

(10) Patent No.: US 7,833,817 B2
(45) Date of Patent: Nov. 16, 2010

(54) FABRICATING METHOD OF IMAGE SENSOR

(75) Inventors: Wenyu Gao, Suzhou (CN); Cedric Lee, Hsinchu (TW)

(73) Assignee: Hejian Technology (Suzhou) Co., Ltd., Suzhou (CN)

( * ) Notice: Subject to any disclaimer, the term of this patent is extended or adjusted under 35 U.S.C. 154(b) by 46 days.

(21) Appl. No.: 12/267,619

(22) Filed: Nov. 10, 2008

(65) Prior Publication Data

US 2009/0068786 A1 Mar. 12, 2009

Related U.S. Application Data

(62) Division of application No. 11/550,417, filed on Oct. 18, 2006, now Pat. No. 7,482,646.

(51) Int. Cl.
*H01L 21/00* (2006.01)

(52) U.S. Cl. .......................... 438/57; 438/69

(58) Field of Classification Search ................ 438/57, 438/59, 69, 70; 257/292, 444, 458, 53
See application file for complete search history.

(56) References Cited

U.S. PATENT DOCUMENTS

| 6,501,065 B1 | 12/2002 | Uppal et al. |
| 6,927,432 B2 | 8/2005 | Holm et al. |
| 7,442,572 B2 * | 10/2008 | Sohn ............................ 438/59 |

* cited by examiner

*Primary Examiner*—Mark Prenty
(74) *Attorney, Agent, or Firm*—Jianq Chyun IP Office

(57) ABSTRACT

A method for fabricating an image sensor includes following steps. First, a substrate having semiconductor devices formed thereon is provided. Interlayer insulating films and Interlayer conductive films are formed on the substrate alternately, wherein the interlayer conductive films are electrically connected to the semiconductor devices. Next, isolated photo-diodes are formed on a topmost layer of the interlayer conductive films, wherein one electrode of the isolated photo-diodes is electrically connected to a topmost layer of the interlayer conductive films. A top insulating layer is formed on the topmost layer of the interlayer conductive films, wherein the isolated photo-diodes are covered by the top insulating layer. A top conductive layer is formed in the top insulating layer, wherein the top conductive layer is electrically connected to another electrode of the isolated photo-diodes.

9 Claims, 8 Drawing Sheets

FABRICATING METHOD OF IMAGE SENSOR

CROSS-REFERENCE TO RELATED APPLICATION

This application is a divisional of an application Ser. No. 11/550,417, filed on Oct. 18, 2006, now allowed. The entirety of each of the above-mentioned patent applications is hereby incorporated by reference herein and made a part of this specification.

BACKGROUND OF THE INVENTION

1. Field of Invention

The present invention relates to an image sensor and a fabricating method thereof. More particularly, the present invention relates to a System-On-Chip (SOC) image sensor having high fill-factor and a fabricating method thereof.

2. Description of Related Art

Image sensors have been widely used in various electronic devices, such as web-cameras, mobile phones with built-in camera, digital still cameras (DSC), and digital video cameras (DV). Typically, image sensors are mainly classified into CCD image sensors and CMOS image sensors. In recent years, concept of System-On-Chip (SOC) is gradually introduced into image sensors. Since CMOS image sensors can be fabricated using standard CMOS processes, it is possible to integrate CMOS image sensors with digital and analog signal processing circuitry.

FIG. 1 is a schematic cross-sectional view of a conventional CMOS image sensor. Referring to FIG. 1, the conventional CMOS image sensor 100 includes a substrate 110, an interconnection layer 120 disposed on the substrate 110, a color filter array 130 disposed on the interconnection layer 120, and a micro-lens array 140 disposed on the color filter array 130. The substrate 110 includes a plurality of isolation regions 112, a plurality of active regions 114 defined by the isolation regions 112, a plurality of CMOS transistors 116 formed on the active regions 114, and a plurality of photo-diodes 118 formed in the active regions 114. The interconnection layer 120 includes a plurality of insulating films 122 and a plurality of metal films 124 stacked on the substrate 110 alternately. The color filter array 130 includes a plurality of color filters 130R for red light penetration, 130G for green light penetration and 130B for blue light penetration. Additionally, the micro-lens array 140 includes a plurality of micro-lens 142, wherein each micro-lens 142 is located on one of the color filters 130R, 130G and 130B, respectively.

There are two major drawbacks for the conventional CMOS image sensor. Firstly, the fill-factor, i.e., the ratio of the sensitive area of photo diode 118 to the area of the pixel 114, is low. That is because the photo diode 118 and 4 transistors 116 in a pixel are fabricated on the same silicon substrate, as shown in FIG. 1. Low fill-factor would decrease the signal-to-noise ratio (S/N), deteriorating the quality of the image. This limitation becomes severer with the CMOS technology upgrade or pixel scaling down. Secondly, the conventional CMOS image sensor has thickness and metal layers limitation for the interconnection 120. In order to reduce light R (or G, B) loss before reaching at the photo diode 118 and to suppress the crosstalk between two neighbor pixel 114, the vertical distance between the photo-diode 118 and the color filter array 130 is required to be kept at about 4 micrometers or less. That means both CMOS image sensor and the other circuit parts of SOC can only use at most four layers of metal films 124 for interconnection. In addition, light R (or G, B) scattering and absorption is severer at low-permittivity-dielectric/barrier-dielectric interfaces in region 120 for <=0.13 um Cu/low-k process. These would cause decreases in both S/N and photo sensitivity.

U.S. Pat. No. 6,902,946B2, entitled "Simplified Upper Electrode Contact Structure For PIN Diode Active Pixel Sensor", and U.S. Pat. No. 6,018,187A, "entitled "Elevated PIN Diode Active Pixel Sensor Including a Unique Interconnection Structure", discloses a elevated PIN diode sensor, in which the PIN diode is located above the image processing circuitry. However, sensors share a common P-type amorphous silicon layer. This would result in crosstalk between the adjacent sensors.

SUMMARY OF THE INVENTION

The present invention provides an image sensor and a method for fabrication to solve the above-mentioned problems.

As embodied and broadly described herein, the invention provides an image sensor. The image sensor includes a substrate having a plurality of semiconductor devices formed thereon, an interconnection layer disposed on the substrate, and a plurality of isolated photo-diodes embedded in the interconnection layer, wherein the isolated photo-diodes are located above the semiconductor devices and electrically connected to the semiconductor devices through the interconnection layer.

In an embodiment of the present invention, the semiconductor devices include metal-oxide-semiconductor transistors, bipolar junction transistors, memories, and other devices that a SOC needed.

In an embodiment of the present invention, the interconnection layer includes a plurality of interlayer insulating films, a plurality of interlayer conductive films, a top insulating layer, and a top conductive layer. The interlayer insulating films and the interlayer conductive films are stacked on the substrate alternately, such that the isolated photo-diodes are disposed on and electrically connected to a topmost layer of the interlayer conductive films. The top insulating layer is disposed on the topmost layer of the interlayer conductive films, wherein the isolated photo-diodes are covered by the top insulating layer. The top conductive layer is embedded in the top insulating layer and electrically connected to one electrode of the isolated photo-diodes.

In an embodiment of the present invention, the interlayer conductive films include reflective films.

In an embodiment of the present invention, the interlayer conductive films include a plurality of connective patterns arranged in multiple layers. Under the photo-diodes, any gaps between interlayer conductive films keeps as small as possible, and add dummy interlayer conductive films so that the overlap area between upper conductive pattern and lower conductive pattern as large as possible.

In an embodiment of the present invention, the top insulating layer has a plurality of trenches for exposing periphery of the top amorphous silicon layer of each isolated photo-diode and a plurality of dual damascene contact openings for exposing the interlayer conductive films, and the top conductive layer includes a common electrode disposed in the trenches and a plurality of bonding pads disposed in the dual damascene contact openings, wherein the common electrode is electrically connected to periphery of the top amorphous silicon layer of each of the isolated photo-diodes and the bonding pads are electrically connected to the interlayer conductive films. In an embodiment of the present invention, the common electrode is a reticular electrode with a plurality of squared openings, such that each of the isolated photo-diodes is located below one of the squared openings respectively. The common electrode may be electrically connected to ground or circuits through a top conductive layer interconnections.

In an embodiment of the present invention, each of the isolated photo-diodes includes a bottom amorphous silicon layer disposed on and electrically connected to the topmost layer of the interlayer conductive films, an intrinsic amorphous silicon layer disposed on the bottom amorphous silicon layer, and a top amorphous silicon layer disposed on the intrinsic amorphous silicon layer and electrically connected to the common electrode. In an embodiment of the present invention, the top amorphous silicon layer may be an n-type amorphous silicon layer, while the bottom amorphous silicon layer may be a p-type amorphous silicon layer. Alternatively, the top amorphous silicon layer may be a p-type amorphous silicon layer, while the bottom amorphous silicon layer may be an n-type amorphous silicon layer.

In an embodiment of the present invention, the image sensor may further include a protection layer disposed on the interconnection layer.

In an embodiment of the present invention, the image sensor may further include a color filter array located above the isolated photo-diodes.

In an embodiment of the present invention, the image sensor may further include a micro-lens array located above the isolated photo-diodes.

As embodied and broadly described herein, the invention provides a method for fabricating an image sensor. The method includes the following steps. First, a substrate having a plurality of semiconductor devices formed thereon is provided. A plurality of interlayer insulating films and a plurality of interlayer conductive films are formed on the substrate alternately, wherein the interlayer conductive films are electrically connected to the semiconductor devices. Then, a plurality of isolated photo-diodes are formed on a topmost layer of the interlayer conductive films, wherein one electrode of the isolated photo-diodes is electrically connected to a topmost layer of the interlayer conductive films. A top insulating layer is formed on the topmost layer of the interlayer conductive films, wherein the isolated photo-diodes are covered by the top insulating layer. A top conductive layer is formed in the top insulating layer, wherein the top conductive layer is electrically connected to another electrode of the isolated photo-diodes.

In an embodiment of the present invention, the isolated photo-diodes may be formed by following steps. First, a bottom amorphous silicon layer is formed on the topmost layer of the interlayer conductive films, an intrinsic amorphous silicon layer is then formed on the bottom amorphous silicon layer, and a top amorphous silicon layer is formed on the intrinsic amorphous silicon layer. Then, a narrow trench is formed by using a photolithographic and isotropic etch process to form isolated photo-diodes.

In an embodiment of the present invention, the amorphous layers of the photo diode, i.e., the top amorphous silicon layer, the intrinsic amorphous silicon layer and the bottom amorphous silicon may be formed by plasma enhanced chemical vapor deposition (PECVD), or sputter process.

In an embodiment of the present invention, the top insulating layer may be formed by following steps. First, a rapid thermal process is performed to form a silicon oxide layer with high quality on the sidewall of the isolated photo-diodes. Then, a planarization layer is formed to cover the high quality silicon oxide layer and fill a space between the isolated photo-diodes. Ultimately, a plurality of trenches and a plurality of dual damascene contact openings are formed in the high quality silicon oxide layer and the planarization layer, wherein periphery of the top amorphous silicon layer of each isolated photo-diode is exposed by the trenches and the topmost layer of the interlayer conductive films are exposed by the dual damascene contact openings.

In an embodiment of the present invention, the high quality silicon oxide layer may be formed by atomic layer chemical vapor deposition (ALCVD) or low temperature rapid thermal process, such as in-situ steam generation (ISSG) oxidation process and photo-enhanced low temperature rapid thermal process.

In an embodiment of the present invention, the planarization layer may be formed by atmospheric pressure chemical vapor deposition (APCVD), plasma enhanced chemical vapor deposition (PECVD), or high density plasma chemical vapor deposition (HDPCVD).

In an embodiment of the present invention, the step of forming the top conductive layer may include the step of forming a common electrode in the trenches, top interconnect lines and a plurality of bonding pads in the dual damascene contact openings simultaneously, wherein the common electrode is electrically connected to all the top electrode of the isolated photo-diodes and the bonding pads are electrically connected to the interlayer conductive films. The top interconnect lines may connect to the interlayer conductive films and/or the common electrode of the photo diode.

In an embodiment of the present invention, the fabricating method further includes a step of forming a protection layer on the interconnection layer.

In an embodiment of the present invention, the fabricating method further includes an optional step, forming a color filter array above the isolated photo-diodes.

In an embodiment of the present invention, the fabricating method further includes an optional step, forming a micro-lens array above the isolated photo-diodes.

Since the isolated photo-diodes of the present invention are embedded in the interconnection layer and located above the semiconductor devices, fill-factor of the isolated photo-diodes is neither restricted by the semiconductor devices formed on the substrate nor the layout density of the interlayer conductive films. The fill-factor is merely relevant to the line width of the top conductive layer. Secondly, since the interlayer conductive films of the present invention are located below the isolated photo-diodes. The total interconnection thickness, the number of conductive layers, and the species of the inter-metal dielectrics do not have any effects on the photo response of the photo diode. The interconnection layer can be chosen based on the requirement of the interconnection of the logic, analog or RF circuits used in a SOC. Therefore, the image sensor and the fabricating method thereof discussed in the present invention facilitate fabrication of the SOC image sensor.

One or part or all of these and other features and advantages of the present invention will become readily apparent to those skilled in this art from the following description wherein there is shown and described an embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

An image sensor with high fill-factor and compatible to system-on-chip is disclosed in the present invention. In the image sensor of the present invention, photo-diodes are embedded in an interconnection layer, such that incident light being received by the photo-diodes would not be scattered by the dielectric interfaces and absorbed by dielectrics in interconnection layer region. Therefore, the fill-factor of the image sensor of the present invention is merely relevant to one or more conductive layer (e.g. a top conductive layer) of the interconnection layer that is disposed above the photo-diodes. Since the interlayer conductive films of the interconnection layer are located below the photo-diodes and more than four layers of interlayer conductive films can be formed in the interconnection layer without deteriorating the properties of the photo-diodes, digital and analog signal processing circuitry can be easily integrated into the interlayer conductive films of the interconnection layer. Therefore, the concept of embedded photo-diodes according to the present invention facilitates production of SOC image sensors.

First Embodiment

Figure 1:
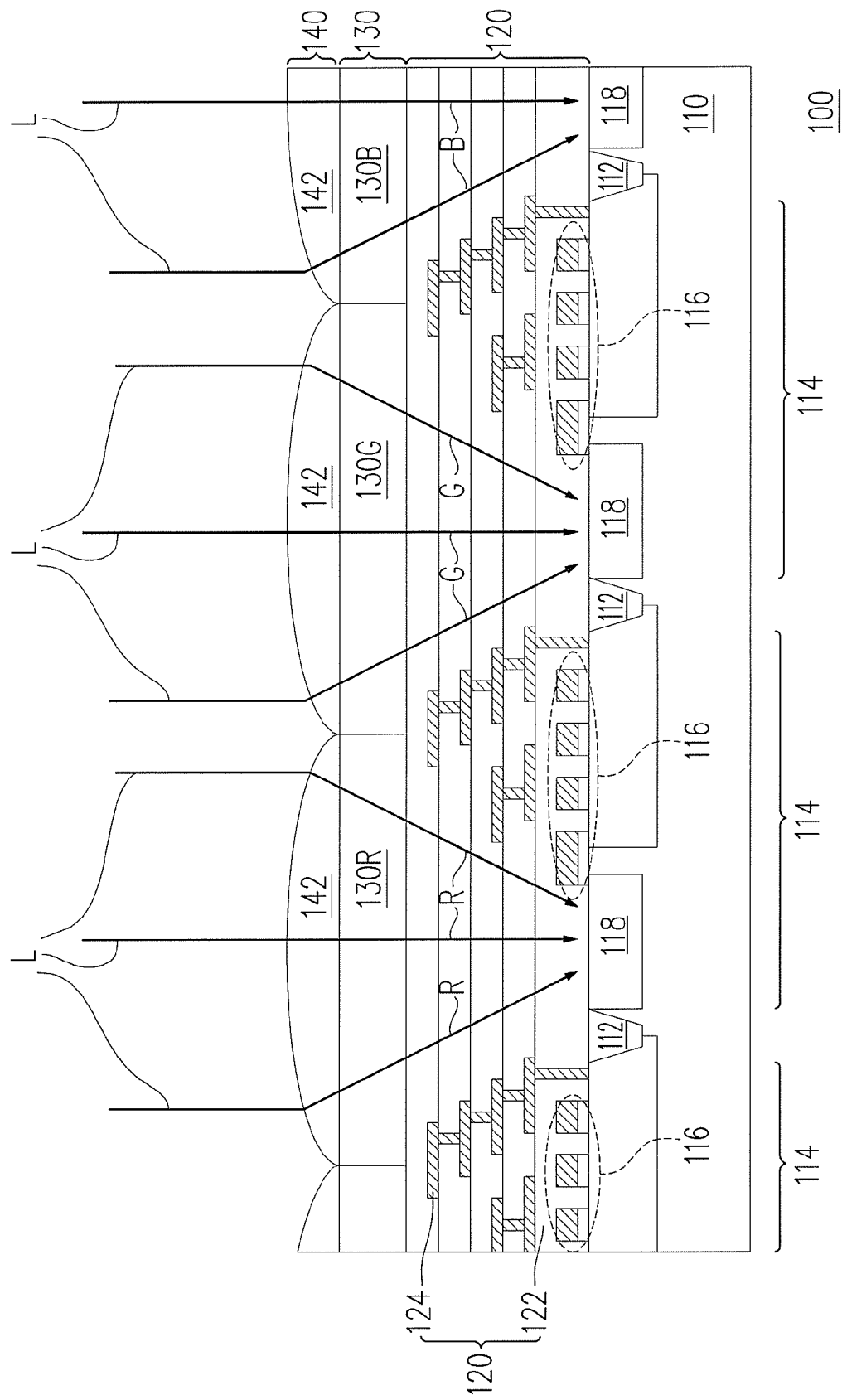
FIG. 1 is a schematic cross-sectional view of a conventional CMOS image sensor.
Figure 2:
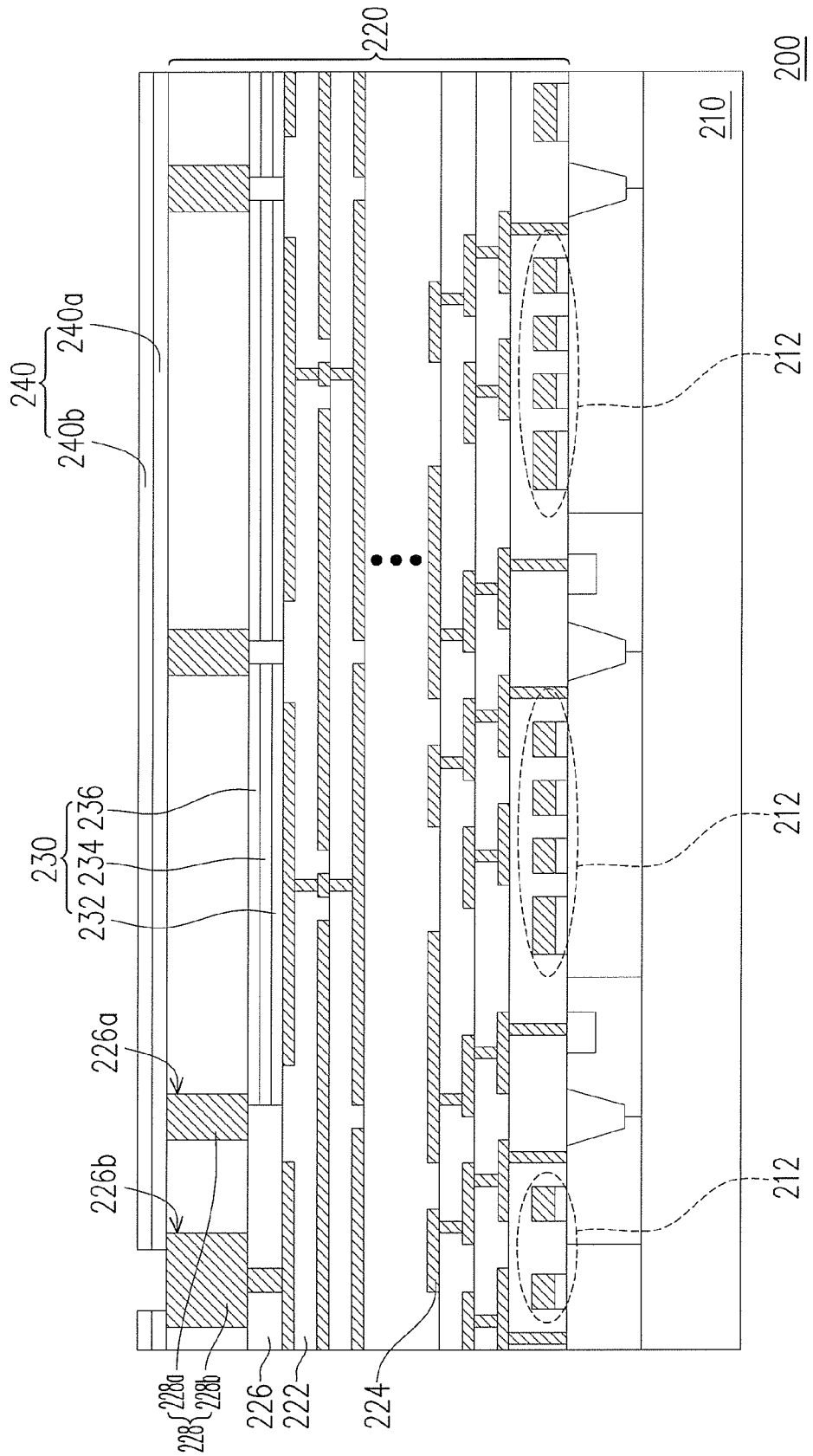
FIG. 2 is a schematic cross-sectional view of a CMOS image sensor according to the first embodiment of the present invention.

FIG. 2 is a schematic cross-sectional view of a CMOS image sensor according to the first embodiment of the present invention. Referring to FIG. 2, an image sensor 200 of the present embodiment includes a substrate 210 (e.g. silicon substrate) having a plurality of semiconductor devices 212 formed thereon, an interconnection layer 220 disposed on the substrate 210, and a plurality of isolated photo-diodes 230 embedded in the interconnection layer 220, wherein the isolated photo-diodes 230 are located above the semiconductor devices 212 and electrically connected to the semiconductor devices 212 through the interconnection layer 220.

In the present embodiment, the semiconductor devices 212 include metal-oxide-semiconductor transistors, bipolar junction transistors, and memories. It should be noted that the semiconductor devices 212 formed on the substrate 210 is not limited to the transistors for processing the photo-electronic signal of the photo-diode, other analog and logical circuitry and memories integrated by active components and passive components (e.g. capacitors, resistors, inductors etc.) can be formed on the substrate 210 also. In order to facilitate production of SOC image sensors, some semiconductor devices (e.g. transistors, memories, capacitors, resistors, inductors etc.) in the digital and analog signal processing circuitry can be fabricated on the same substrate 210 (no show in FIG. 2).

As shown in FIG. 2, the interconnection layer 220 includes a plurality of interlayer insulating films 222, a plurality of interlayer conductive films 224, a top insulating layer 226, and a top conductive layer 228. The interlayer insulating films 222 and the interlayer conductive films 224 are stacked on the substrate 210 alternately. The top insulating layer 226 is formed on the topmost layer of the interlayer conductive films 224, wherein the isolated photo-diodes 230 are covered by the top insulating layer 226. The top conductive layer 228 is embedded in the top insulating layer 226 and the top conductive layer 228a electrically connected to the top amorphous silicon layer 236 of the isolated photo-diodes 230. In the present embodiment, the interconnection layer 220 may have more than three layers of interlayer conductive films 224 such that the interconnection layer 220 may have more than four layers of conductive films (i.e. one top conductive film 228 plus more three interlayer conductive films 224). In the present embodiment, the digital and analog signal processing circuitry can be easily integrated into the interconnection layer 220 and the substrate 210 even though the digital and analog signal processing circuitry is complicated. When the digital and analog signal processing circuitry is complicated and requires being constructed by several conductive films, the total thickness of the interconnection layer 220 is increased significantly. However, the properties, e.g. photosensitivity and signal-to-noise ratio, of the isolated photo-diodes 230 would not be influenced by the increased thickness of the interconnection layer 220. In addition, metal-insulator-metal capacitor can be fabricated in the interconnection layer 220, and inductor can be formed by using top conductive film 228 and interlayer conductive films 224 (not show in FIG. 2). After formation of interconnection layer 220, a protection layer 240 is disposed on it. In the present embodiment, the protection layer 240 is composed of a silicon nitride or silicon oxy-nitride layer 240a and a silicon oxide layer 240b.

Figure 3:
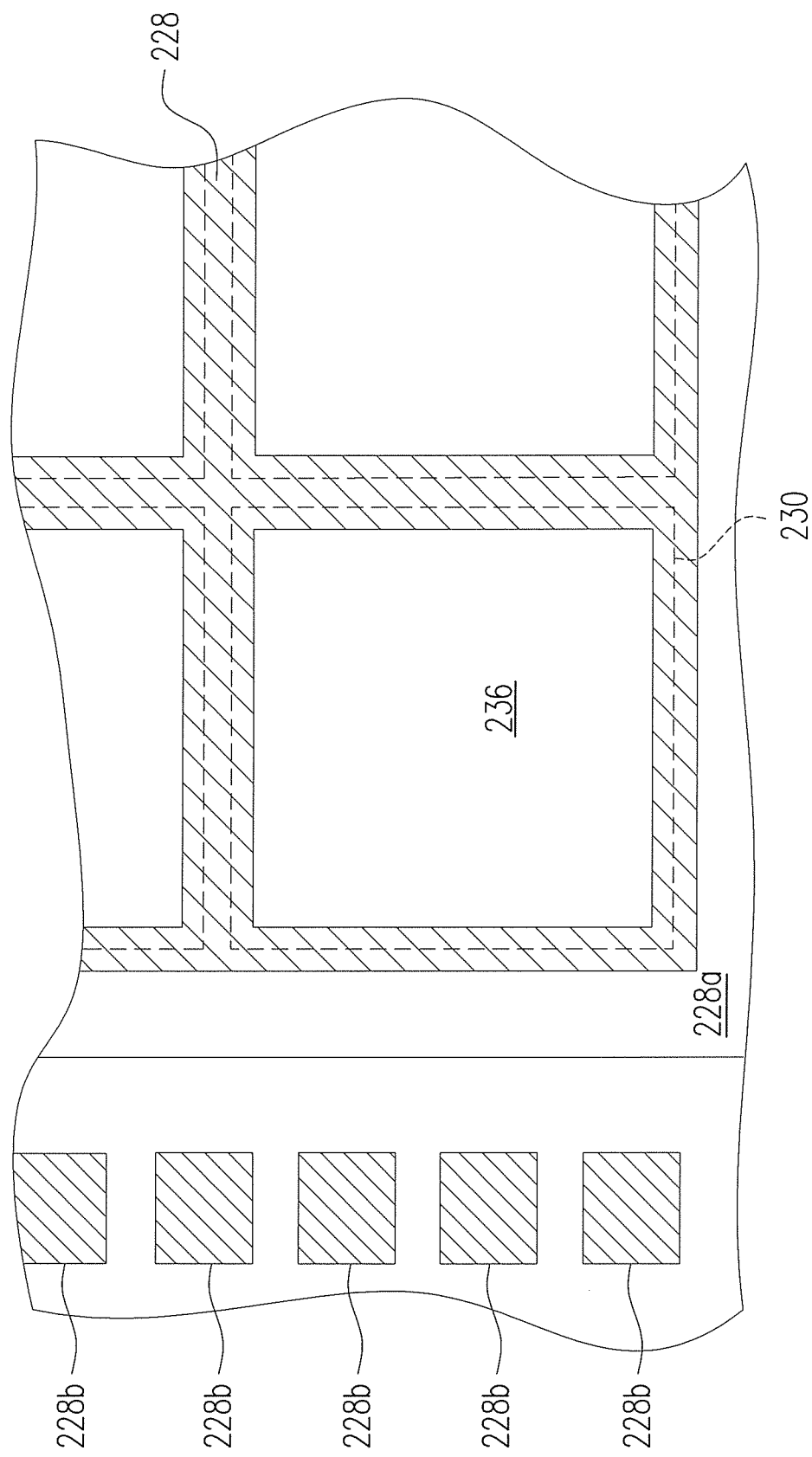
FIG. 3 is a schematic top view of a CMOS image sensor according to an embodiment of the present invention.

FIG. 3 is a schematic top view of a CMOS image sensor according to an embodiment of the present invention. Referring to FIG. 2 and FIG. 3, the top insulating layer 226 has a plurality of trenches 226a for exposing periphery of the top amorphous silicon layer 236 of each isolated photo-diode 230 and a plurality of dual damascene contact openings 226b for exposing the interlayer conductive films 224. Correspondingly, the top conductive layer 228 includes a common electrode 228a disposed in the trenches 226a, a plurality of top interconnect lines (not shown) and a plurality of bonding pads 228b disposed in the dual damascene contact openings 226b, wherein the common electrode 228a is electrically connected to periphery of the top amorphous silicon layer 236 of each of the isolated photo-diodes 230 and the bonding pads 228b are electrically connected to the interlayer conductive films 224. In the present embodiment, the common electrode 228a is a reticular electrode with a plurality of squared openings (shown in FIGS. 2 and 3), such that each of the isolated photo-diodes 230 is located below one of the squared openings respectively. Additionally, the common electrode 228a may be made of copper, aluminum, tungsten, or other conductive materials.

As shown in FIG. 2, each of the isolated photo-diodes 230 includes a bottom amorphous silicon layer 232 disposed on and electrically connected to the topmost layer of the interlayer conductive films 224, an intrinsic amorphous silicon layer 234 disposed on the bottom amorphous silicon layer 232, and a top amorphous silicon layer 236 disposed on the intrinsic amorphous silicon layer 234 and electrically connected to the common electrode 228a. Specifically, the common electrode 228a is electrically connected to periphery of the top amorphous silicon layer 236 and the topmost layer of the interlayer conductive films 224 is electrically connected to a bottom surface of the bottom amorphous silicon layer 232. The thickness of the intrinsic amorphous silicon layer 234, and the thickness and doping concentration in the bottom amorphous silicon layer 232 and the top amorphous silicon layer 236 can be adjusted to optimize the opti-electrical characteristics during the PECVD process or sputtering process.

Figure 4:
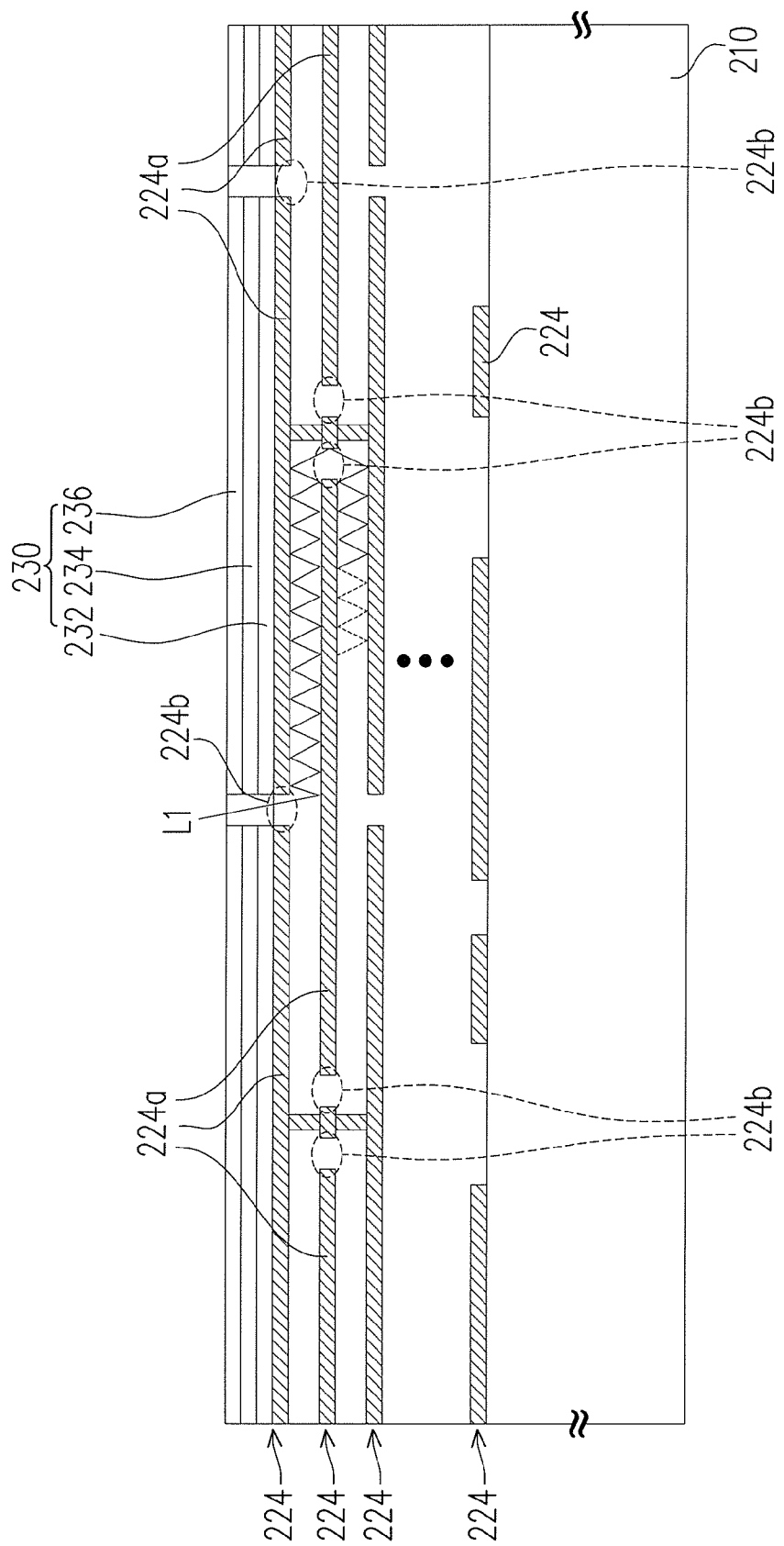
FIG. 4 is a schematic cross-sectional view of the interconnection layer according to an embodiment of the present invention.

FIG. 4 is a schematic cross-sectional view of the interconnection layer according to an embodiment of the present invention. In the present embodiment, the interlayer conductive films 224 may be reflective films, such as aluminum films, copper films, or combination thereof. Specifically, the topmost layer of the interlayer conductive films 224 may be made of aluminum or other conductive materials with excellent reflectivity, while the other interlayer conductive films 224 may be made of aluminum, copper or other conductive materials with small resistivity. In order to prevent stray light L1 from irradiating on the substrate 210, the interlayer conductive films 224 include a plurality of connective patterns 224a arranged in multiple layers. Additionally, a gap 224b between any two adjacent conductive patterns 224a in an upper layer is located above one of the connective patterns 224a in a lower layer next to the upper layer, and the connective patterns 224a in the lower layer overlap with the conductive patterns 224a in the upper layer. (i.e., keep the gap as small as possible and the overlap area as large as possible between the upper conductive layer and the lower conductive layer.) When the stray light L1 passing through the gap 224b between any two adjacent conductive patterns 224a in an upper layer, the stray light L1 is reflected by one of the connective patterns 224a in a lower layer next to the upper layer, such that the stray light L1 can be reflected and conducted between connective patterns 224a arranged in different layers. After the stray light L1 is reflected by the connective patterns 224a, intensity of the stray light L1 can be reduced gradually. Therefore, the stray light L1 can hardly irradiate on the substrate 210 and the circuitry noise can be significantly reduced.

Figure 5:
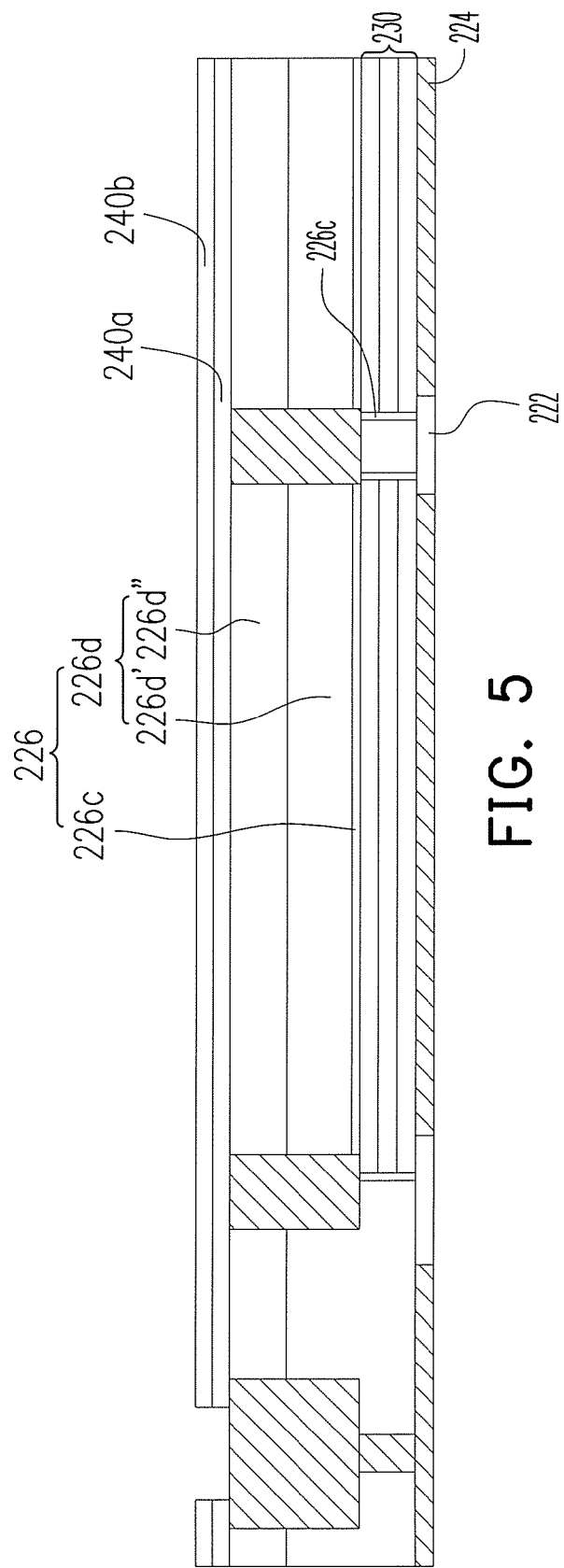
FIG. 5 is a schematic cross-sectional view of the top insulating film according to an embodiment of the present invention.

FIG. 5 is a schematic cross-sectional view of the top insulating film according to an embodiment of the present invention. In order to ensure electrical insulation between each isolated photo-diodes 230, the top insulating film 226 is formed to fill the space between the isolated photo-diodes 230. The detail structure of the top insulating film 226 is described hereinafter.

The top insulating film 226 includes a high quality silicon oxide layer 226c formed on the surface and sidewall of the isolated photo-diodes 230 and a planarization layer 226d formed to cover the high quality silicon oxide layer 226c and fill the space between the isolated photo-diodes 230. The high quality silicon oxide layer 226c may be formed by deposition or rapid thermal process. The planarization layer 226d may further include an APCVD silicon dioxide layer 226d' and a PECVD silicon dioxide layer 226d'' formed over the APCVD silicon dioxide layer 226d' and be planarized by chemical-mechanical-polish (CMP). In an embodiment, the thickness of the high quality silicon oxide layer 226c is about 30 angstroms to 100 angstroms.

After formation of the top insulating layer 226, a protection layer 240 is disposed on it. In the present embodiment, the protection layer 240 is composed of a silicon nitride or silicon oxy-nitride layer 240a and a silicon oxide layer 240b. The silicon nitride or silicon oxy-nitride layer 240a can be formed by PECVD method. The oxide layer 240b can be formed either by PECVD or APCVD. In an embodiment, both the thickness of the silicon nitride layer 240a and the silicon oxide layer 240b is about 1000 angstroms to 3000 angstroms.

Second Embodiment

Figure 6:
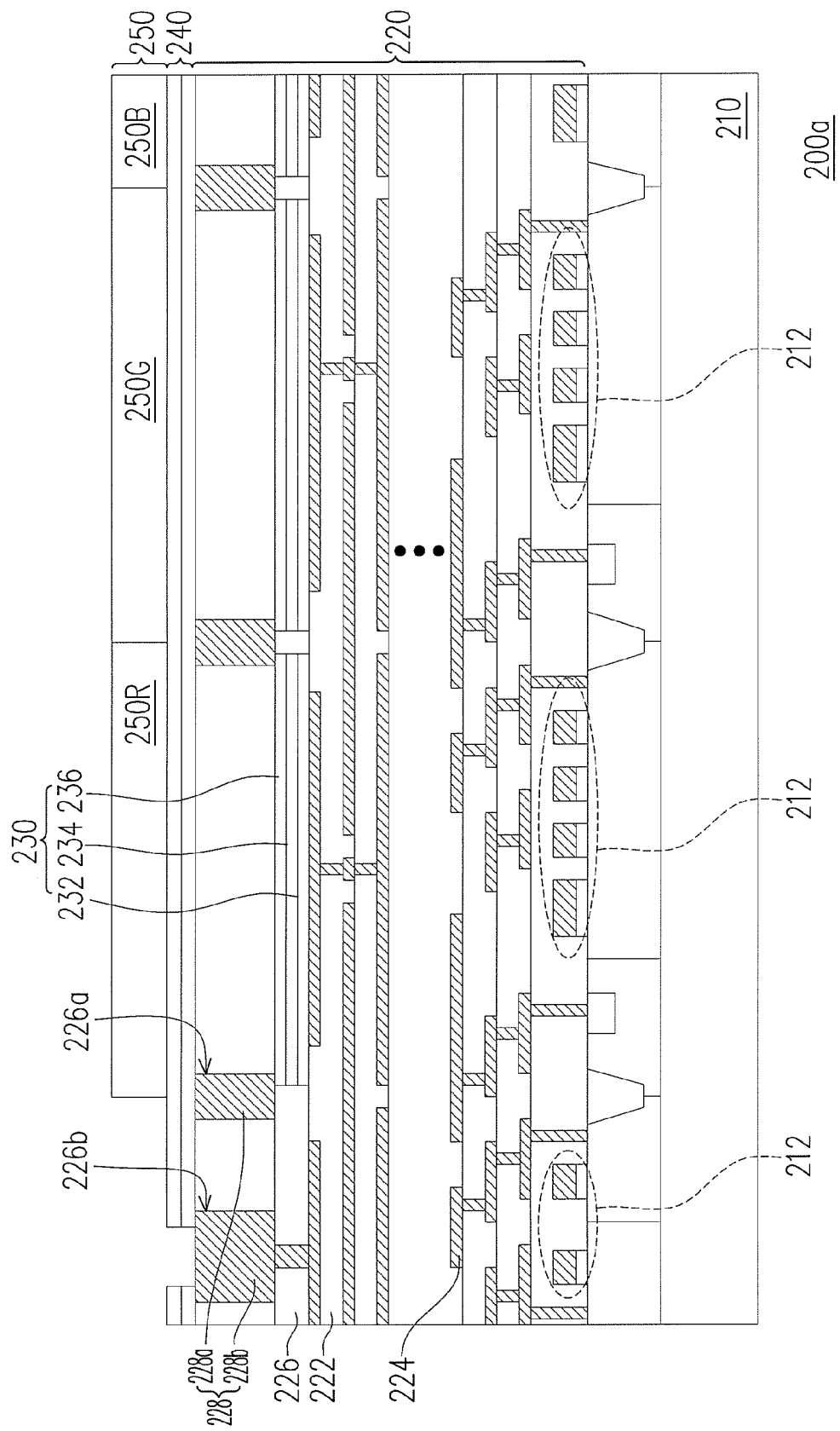
FIG. 6 is a schematic cross-sectional view of a CMOS image sensor according to the second embodiment of the present invention.

FIG. 6 is a schematic cross-sectional view of a CMOS image sensor according to the second embodiment of the present invention. The image sensor 200a of the present embodiment is similar with the image sensor 200 shown in FIG. 2 except that the image-sensor 200a further includes a color filter array 250 located above the protection layer 240 and the isolated photo-diodes 230. The color filter array 250 includes a plurality of color filters 250R, 250G and 250B for light penetration of red, green and blue, respectively.

Third Embodiment

Figure 7:
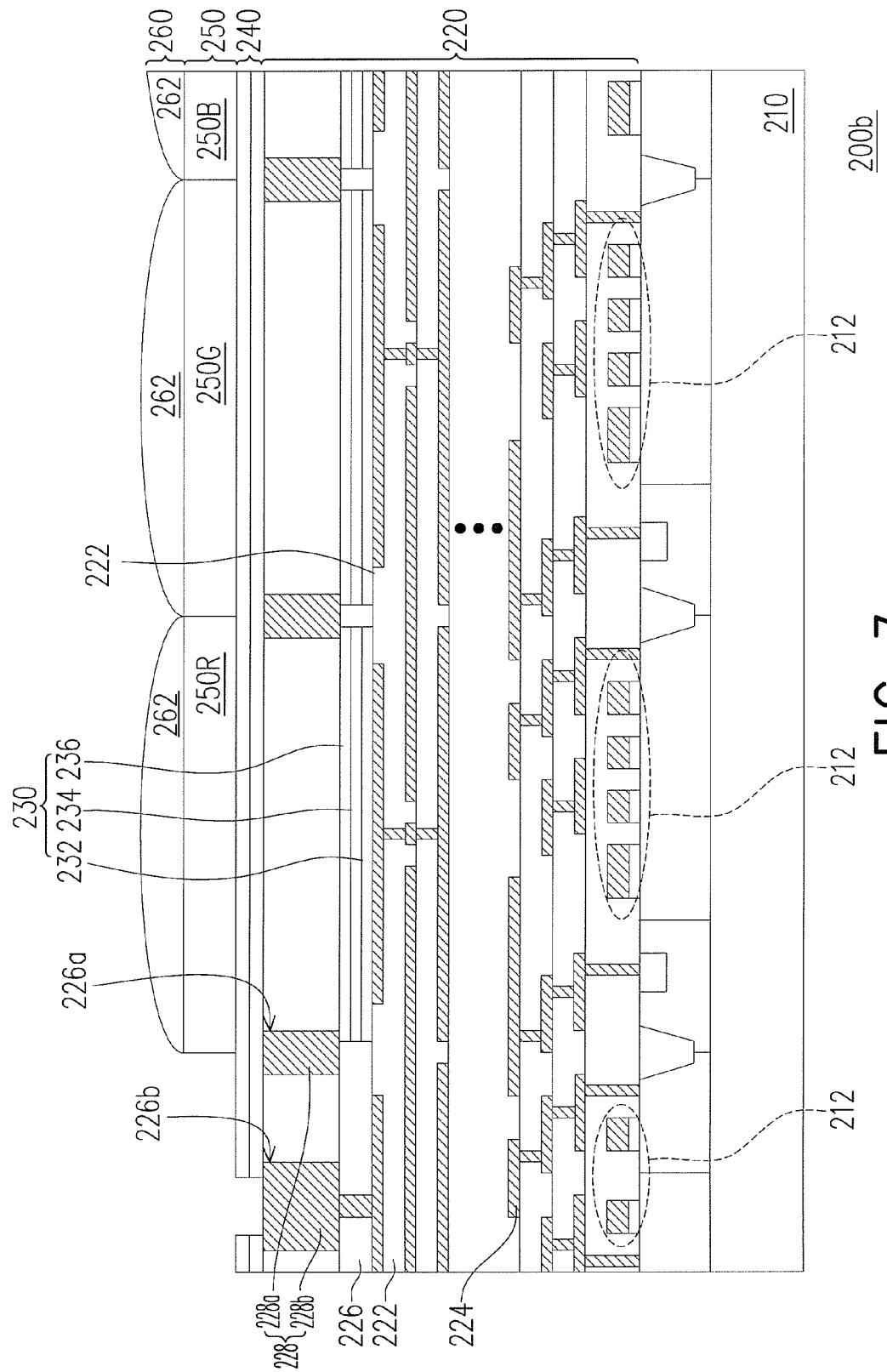
FIG. 7 is a schematic cross-sectional view of a CMOS image sensor according to the third embodiment of the present invention.

FIG. 7 is a schematic cross-sectional view of a CMOS image sensor according to the third embodiment of the present invention. The image sensor 200b of the present embodiment is similar with the image sensor 200a shown in FIG. 6 except that the image sensor 200b further includes a micro-lens array 260. In the present embodiment, the micro-lens array 260 includes a plurality micro-lens 262, wherein each micro-lens 262 is located on one of the color filters 250R, 250G and 250B, respectively.

Fourth Embodiment

Figure 8:
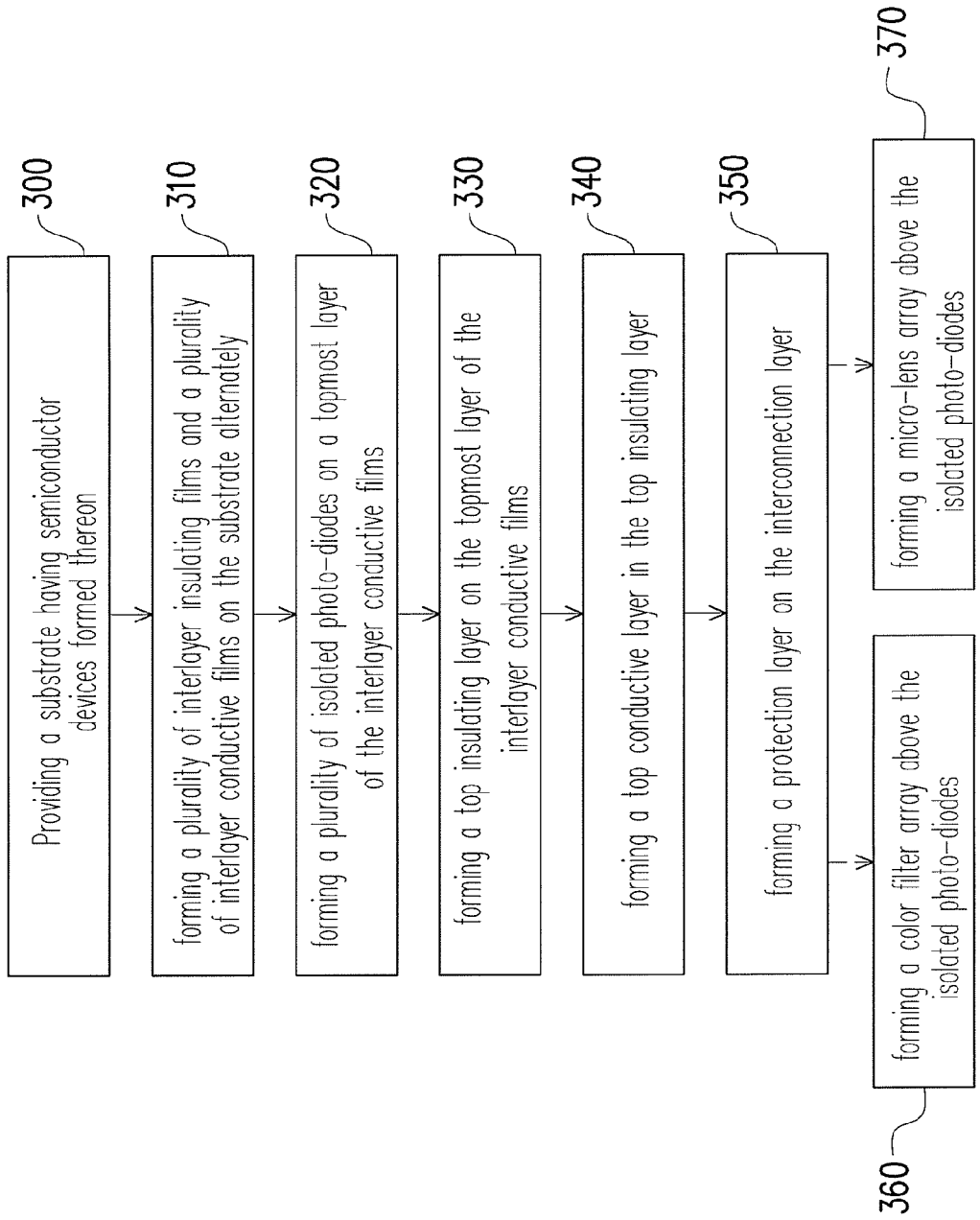
FIG. 8 is a flow diagram of a fabricating method of a CMOS image sensor according to an embodiment of the present invention.

FIG. 8 is a flow diagram of a fabricating method of a CMOS image sensor according to an embodiment of the present invention. Referring to FIG. 8, the fabricating method of a CMOS image sensor includes step 300, step 310, step 320, step 330, step 340, and step 350.

Referring to FIG. 7 and step 300 in FIG. 8, a substrate 210 having a plurality of semiconductor devices 212 formed thereon is provided. Specifically, the substrate 210 used may be a silicon substrate or other semiconductor substrate. The semiconductor devices 212 formed on the substrate 210 may be fabricated by prior art CMOS processes.

Referring to FIG. 7 and step 310 in FIG. 8, a plurality of interlayer insulating films 222 and a plurality of interlayer conductive films 224 are formed on the substrate 210 alternately. Specifically, the bottommost layer of the interlayer conductive films 224 is formed on the substrate 210 to cover the semiconductor devices 212 first. Then the interlayer conductive films 224 and the interlayer insulating films 222 are alternately formed over the bottommost layer of the interlayer conductive films 224.

Referring to FIG. 7 and step 320 in FIG. 8, after the interlayer insulating films 222 and the interlayer conductive films 224 are formed, the isolated photo-diodes 230 are formed on and electrically connected to the topmost layer of the interlayer conductive films 224. In an embodiment of the present invention, the isolated photo-diodes 230 may be formed by following steps. First, a bottom amorphous silicon layer 232 is formed on the topmost layer of the interlayer conductive films 224. Then, an intrinsic amorphous silicon layer 234 is formed on the bottom amorphous silicon layer 232. Ultimately, a top amorphous silicon layer 236 is formed on the intrinsic amorphous silicon layer 234. The bottom amorphous silicon layer 232, the intrinsic amorphous silicon layer 234 and the top amorphous silicon layer 236 may be formed by deposition and etching processes.

Referring to FIG. 5, FIG. 7 and step 330 in FIG. 8, after the isolated photo-diodes 230 are formed, a top insulating layer 226 is formed on the topmost layer of the interlayer conductive films 224, such that the isolated photo-diodes 230 can be covered by the top insulating layer 226 both on top surface and sidewall surface. Specifically, the top insulating layer 226 is formed on the topmost layer of the interlayer conductive films 224, wherein the isolated photo-diodes 230 are covered by the top insulating layer. In the present embodiment, the top insulating layer 226 may be formed by following steps. First, a high quality silicon oxide 226c is formed (shown in FIG. 5) on the surface and sidewall of the isolated photo-diodes 230. Then, a planarization layer 226d (shown in FIG. 5) is formed to cover the high quality silicon oxide layer 226c and fill a space between the isolated photo-diodes 230. More preferably, the planarization layer 226d may be formed by sequentially depositing a high quality silicon oxide layer 226c and a planarization layer 226d (shown in FIG. 5). Ultimately, a plurality of trenches 226a and a plurality of dual damascene contact openings 226b are formed in the high quality silicon oxide layer 226c and the planarization layer 226d, wherein periphery of the top amorphous silicon layer of each isolated photo-diode 230 is exposed by the trenches 226a and the topmost layer of the interlayer conductive films 224 are exposed by the dual damascene contact openings 226b. Additionally, the trenches 226a and the dual damascene contact openings 226b are formed by dual damascene process.

In an embodiment, the high quality silicon oxide layer 226c can be formed by low temperature atomic layer chemical vapor deposition (ALCVD) or low temperature rapid thermal process, such as in-situ steam generation (ISSG) oxidation process and photo-enhanced low temperature rapid thermal process. The purpose of using low temperature process is not to affect the properties of the photo-diode and the CMOS circuitries. If using low temperature rapid thermal process, a thin protection silicon oxide or nitride can be used to cover the topmost layer of the interlayer conductive films 224 outside the diode region 230 before the photo diode 230 formation. The planarization layer 226d may be formed by atmospheric pressure chemical vapor deposition (APCVD) and plasma enhanced chemical vapor deposition (PECVD). Specifically, the planarization layer 226d may include an APCVD silicon dioxide layer 226d' and a PECVD silicon dioxide layer 226d" formed by atmospheric pressure chemical vapor deposition (APCVD) and plasma enhanced chemical vapor deposition (PECVD), respectively.

Referring to FIG. 7 and step 340 in FIG. 8, a top conductive layer 228 is formed and embedded in the top insulating layer such that the top conductive layer 228 can be electrically connected to the isolated photo-diodes 230. In an embodiment of the present invention, the step of forming the top conductive layer 228 may include the step of forming a common electrode 228a in the trenches 226a and a plurality of bonding pads 228b in the dual damascene contact openings 226b simultaneously, wherein the common electrode 228a is electrically connected to all of the isolated photo-diodes 230 and the bonding pads 228b are electrically connected to the interlayer conductive films 224.

After forming the top conductive layer 228, a protection layer 240 is formed on the interconnection layer 220. The protection layer 240 may be made of silicon dioxide, silicon nitride, or other insulating materials. Additionally, the protection layer 240 may be formed by CVD process.

It should be noted that the fabricating method may optionally include step 360, and/or step 370. Referring to FIG. 7 and step 360 in FIG. 8, after forming the protection layer 240, a color filter array 250 including color filters 250R, 250G and 250B may be formed above the isolated photo-diodes 230. The color filters 250R, 250G and 250B may be made of photo-resist layers which convert light into different light beams with different wavelengths, respectively.

Referring to FIG. 7 and step 370 in FIG. 8, after forming the protection layer 240 or the color filter array 250, a micro-lens array 260 including a plurality of micro-lens 262 is formed above the isolated photo-diodes 230.

As described above, the present invention at least provides the following advantages:

In the image sensor of the present invention, thickness of the interconnection layer is not limited such that the image sensor of the present invention can be easily integrated together with any logic, analog and memory circuitries. Therefore, CMOS image sensor SOC can be fabricated easily.

Since the photo diode of the image sensor is fabricated above the MOS devices, logic, mix-mode and memory circuitries, the photo diode can use almost whole chip area except for bonding PAD area. In other words, the size of the CMOS image sensor SOC chip can be reduced significantly.

The fill-factor of the conventional CMOS image sensor is limited by the size and number of the pixel transistors since both the pixel transistors and photo diodes are fabricated on the silicon surface, e.g., less than 40% for sub-0.18 um CMOS technology and reduces as chip scaling down. On the contrary, the fill-factor of the image sensor of the present invention is related to the size of the common metal electrode or the width of the photo diode isolation. Therefore, typical fill-factor of the CMOS image sensor in the present invention is larger than 80% even as chip scaling down.

The conventional sensor photo diodes share the same P-type crystal silicon layer, and the U.S. Pat. No. 6,902,946 invented diodes share the same P-type amorphous silicon layer. In those prior arts, the crosstalk between two neighbor sensors due to the common silicon layer is severe. This kind of crosstalk can be eliminated in the present invention because all the photo diodes are isolated by high quality silicon oxide layers. As for the crosstalk induced by incident light, the image sensor of the present invention can reduce it (crosstalk) through adjusting the thickness of the common metal electrode.

The fabrication method in the present invention is easy to be implanted. Only one additional mask for the photo diode isolation is needed. The opto-electronic characteristics of the photo-diode can be tuned by adjusting the thickness and doping concentration of each amorphous silicon layer, which have not any effects on the CMOS device fabricated on the silicon wafer. For the conventional CMOS image sensor process, tuning the properties of the photo diodes is a challenge. That is because the diodes share the same thermal budget with the CMOS devices and the sidewall of the diodes share the same bottom region with the pixel transistors.

The foregoing descriptions of the embodiments of the present invention have been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating an image sensor, comprising:
   providing a substrate having a plurality of semiconductor devices formed thereon;
   forming a plurality of interlayer insulating films and a plurality of interlayer conductive films on the substrate alternately, wherein the interlayer conductive films are electrically connected to the semiconductor devices;
   forming a plurality of isolated photo-diodes on the topmost layer of the interlayer conductive films, wherein a bottom amorphous silicon layer of the isolated photo-diodes are electrically connected to the topmost layer of the interlayer conductive films;
   forming a top insulating layer on the topmost layer of the interlayer conductive films, wherein the isolated photo-diodes are covered by the top insulating layer; and
   forming a top conductive layer in the top insulating layer, wherein the top conductive layer is electrically connected to a top amorphous silicon layer of the isolated photo-diodes, and the step of forming the top insulating layer comprises:
      performing a low temperature rapid thermal process or atomic layer chemical vapor deposition to form a high quality silicon oxide layer on a surface and sidewall of the isolated photo-diodes;
      forming a planarization layer to cover the high quality silicon oxide layer and fill a space between the isolated photo-diodes;
      performing a chemical-mechanical-polish (CMP) process to planarize the planarization layer;
      forming a plurality of trenches and a plurality of dual damascene contact openings in the high quality silicon oxide layer and the planarization layer, wherein periphery of the top amorphous silicon layer of each isolated photo-diode is exposed by the trenches and the topmost layer of the interlayer conductive films are exposed by the dual damascene contact openings.

2. The method as claimed in claim 1, wherein the step of forming the isolated photo-diodes comprises:
   forming a bottom amorphous silicon layer on the topmost layer of the interlayer conductive films;
   forming an intrinsic amorphous silicon layer on the bottom amorphous silicon layer; and
   forming a top amorphous silicon layer on the intrinsic amorphous silicon layer.

3. The method as claimed in claim 2, wherein the top amorphous silicon layer, the intrinsic amorphous silicon layer and the bottom-type amorphous silicon is formed by plasma enhanced chemical vapor deposition (PECVD) process or sputter process.

4. The method as claimed in claim 1, wherein the planarization layer is formed by atmospheric pressure chemical vapor deposition (APCVD) plasma enhanced chemical vapor deposition (PECVD), or high density plasma chemical vapor deposition (HDPCVD).

5. The method as claimed in claim 1, wherein the high quality silicon oxide layer is formed by atomic layer chemical vapor deposition (ALCVD), low temperature in-situ steam generation (ISSG) oxidation process or photo-enhanced low temperature rapid thermal process.

6. The method as claimed in claim 1, wherein the step of forming the top conductive layer comprises:
   forming a common electrode in the trenches, a plurality of top interconnect lines and a plurality of bonding pads in the dual damascene contact openings simultaneously, wherein the common electrode is electrically connected to all of the top amorphous silicon layer of the isolated photo-diodes and the top interconnect lines and the bonding pads are electrically connected to the interlayer conductive films.

7. The method as claimed in claim 1, further comprising a step of forming a protection layer on the top insulating layer.

8. The method as claimed in claim 1, further comprising a step of forming a color filter array above the isolated photo-diodes.

9. The method as claimed in claim 1, further comprising a step of forming a micro-lens array above the isolated photo-diodes.

* * * * *